(12) United States Patent
Kim et al.

(10) Patent No.: US 7,964,250 B2
(45) Date of Patent: Jun. 21, 2011

(54) FLEXIBLE DISPLAY DEVICE HAVING ENHANCED THIN FILM SEMICONDUCTIVE LAYER AND METHOD OF MANUFACTURE

(75) Inventors: Byoung-June Kim, Seongnam-si (KR); Sung-Hoon Yang, Seoul (KR); Jae-Ho Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 411 days.

(21) Appl. No.: 11/677,353

(22) Filed: Feb. 21, 2007

(65) Prior Publication Data

US 2007/0196576 A1     Aug. 23, 2007

(30) Foreign Application Priority Data

Feb. 21, 2006   (KR) .................. 10-2006-0016623

(51) Int. Cl.
*B05D 3/00*   (2006.01)
(52) U.S. Cl. .................. 427/532; 427/248.1; 427/554
(58) Field of Classification Search ............... 427/248.1, 427/372.2, 569, 578, 331; 204/192.1; 438/485
See application file for complete search history.

(56) References Cited

U.S. PATENT DOCUMENTS

| | | | | |
|---|---|---|---|---|
| 5,529,630 A | * | 6/1996 | Imahashi et al. | ............... 118/665 |
| 5,738,909 A | * | 4/1998 | Thakur et al. | ............... 427/255.4 |
| 2001/0034075 A1 | * | 10/2001 | Onoya | ............... 438/34 |
| 2002/0132452 A1 | * | 9/2002 | Oka et al. | ............... 438/478 |
| 2003/0000475 A1 | * | 1/2003 | Voutsas et al. | ............... 118/715 |
| 2004/0016924 A1 | * | 1/2004 | Yamada et al. | ............... 257/59 |
| 2005/0082537 A1 | * | 4/2005 | Arao et al. | ............... 257/72 |
| 2006/0030085 A1 | * | 2/2006 | Park et al. | ............... 438/149 |

FOREIGN PATENT DOCUMENTS

| | | |
|---|---|---|
| JP | 2000-058836 | 2/2000 |
| JP | 2000-068518 | 3/2000 |
| JP | 2000-081642 A | 3/2000 |
| JP | 2001-332734 A | 11/2001 |
| JP | 2004-311895 | * 11/2004 |
| JP | 2004-311895 A | 11/2004 |
| JP | 2004-342753 | 12/2004 |
| KR | 10-2002-36916 | 5/2002 |
| KR | 10-2003-47571 | 6/2003 |
| KR | 10-2005-25239 | 3/2005 |
| KR | 10-2005-103813 | 8/2005 |
| WO | WO 2005/050754 | * 6/2005 |

OTHER PUBLICATIONS

Yang et al, Stability of low-temperature amorphous silicon thin film transistors formed on glass and transparent plastic substrates, J. Vac. Sci. Technol. B 18(2), 2000, p. 683-689.*

Rebib et al, Structural and optical investigations of SiOxNy thin films deposited by R.F. sputtering, Surface & Coatings Technology 200, 2005, p. 330-333.*

(Continued)

*Primary Examiner* — Timothy H Meeks
*Assistant Examiner* — Elizabeth Burkhart
(74) *Attorney, Agent, or Firm* — Innovation Counsel LLP

(57) ABSTRACT

A manufacturing method for a flat panel display device includes forming a barrier layer on a flexible plastic substrate by RF sputtering, forming an amorphous silicon layer on the plastic substrate, and subjecting the amorphous silicon layer to a rapid heat treatment so as to thereby improve electrical characteristics and/or homogeneity of the amorphous silicon layer.

21 Claims, 11 Drawing Sheets

OTHER PUBLICATIONS

Pinard et al, Synthesis and physiochemical characterization of silicon oxynitride thin films prepared by rf magnetron sputtering, Applied Optics, vol. 36, Issue 22, 1997, p. 5451-5460.*

Choi et al, Novel method for fabrication of hydrogenated amorphous silicon and high quality poly-Si films on the same substrate by employing excimer laser, Mater. Res. Soc. Symp. Proc., vol. 467, 1997, Abstract.*

Liu et al, Low-energy excitations in amorphous films of silicon and germanium, Physical Review B, vol. 58, No. 14, 1998, p. 9067-9081.*

Serikawa et al, Low-temperature fabrication of high-mobility poly-si TFT's for large-area LCD's, IEEE Transactions on Electron Devices, vol. 36, No. 9, 1989, p. 1929-1933.*

English Language Abstract, JP Patent First Publication No. 2000-058836, Feb. 25, 2000, 1 page.

English Language Abstract, JP Patent First Publication No. 2000-068518, Mar. 3, 2000, 1 page.

English Language Abstract, JP Patent First Publication No. 2004-342753, Dec. 2, 2004, 1 page.

English Language Abstract, KR Patent First Publication No. 10-2002-36916, May 17, 2002, 1 page.

English Language Abstract, KR Patent First Publication No. 10-2003-47571, Jun. 18, 2003, 1 page.

English Language Abstract, KR Patent First Publication No. 10-2005-25239, Mar. 14, 2005, 1 page.

English Language Abstract, KR Patent First Publication No. 10-2005-103813, Aug. 19, 2005, 1 page.

* cited by examiner

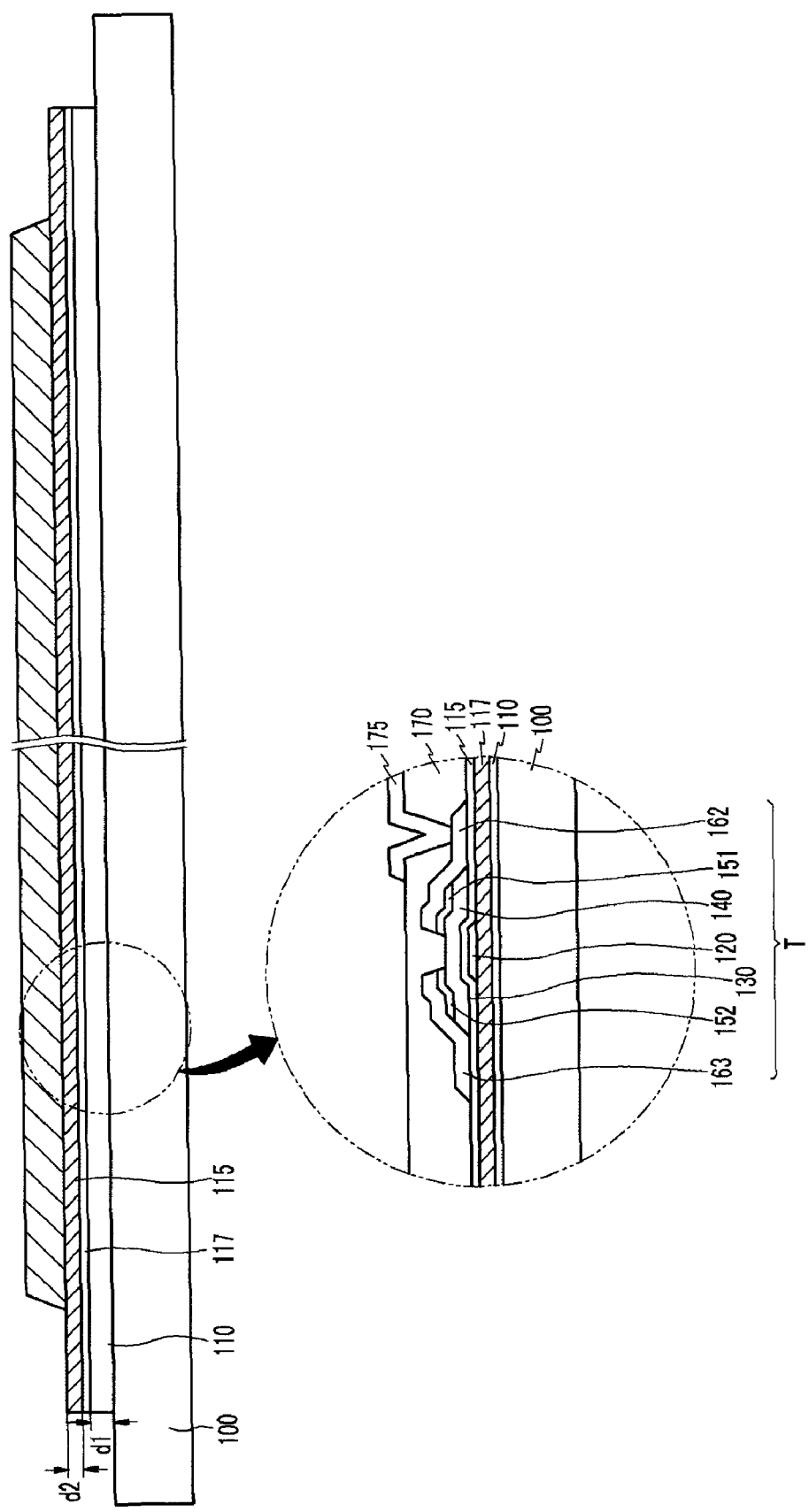

FLEXIBLE DISPLAY DEVICE HAVING ENHANCED THIN FILM SEMICONDUCTIVE LAYER AND METHOD OF MANUFACTURE

CROSS-REFERENCE TO RELATED APPLICATION

This application claims priority to and the benefit of Korean Patent Application No. 10-2006-0016623 filed in the Korean Intellectual Property Office on Feb. 21, 2006, the disclosure of which is incorporated herein by reference.

BACKGROUND (a) Field of Invention

The present disclosure of invention relates to flexible flat panel display devices such as those that use flexible plastic substrates and to manufacturing methods for the same.

(b) Description of Related Art

Older flat panel displays utilize rigid and brittle glass as the main support for thin film layers disposed thereon. Such an approach has the disadvantage that the display cannot be flexed even a little bit and that it cannot be safely dropped without fear of breakage. Also the conventional, thick glass substrates tended to be relatively heavy. In light of this, flexible flat panel displays using a flexible substrate such as one composed predominantly of a plastic have been developed so as to provide a flat panel display having light weight, impact resistance, and flexibility.

Flexible flat panel displays may include those of the liquid crystal display (LCD) type, the organic light emitting display (OLED) type, electrophoretic particle type, and so forth. The flexible flat panel displays include plastic support layers (substrates) for providing impact resistance and low production cost.

However, the plastic material in such substrates often has a relatively large coefficient of thermal expansion (COTE) and thus easily expands due to high temperature during the manufacturing process. In order to minimize this expansion problem, various thin films that are layered on the plastic substrates and used for displaying images are formed on the respective plastic substrates while limiting process temperature to no more than about 180° C. or lower. However, this constraint on process temperature process may prevent the manufacture of thin films having desired purities or other characteristics that are associated with good quality display devices.

Some of the information disclosed here in this Related Art section is written for providing clearer understanding of the nature of the invention and it may contain disclosure that does not form part of the prior art as known to persons of ordinary skill in the art.

SUMMARY

A manufacturing method in accordance with one embodiment includes the steps of: (a) forming a thin and flexible barrier layer composed of an oxide on a flexible and transparent plastic substrate by use of RF sputtering, (b) forming an amorphous silicon layer on the barrier layer by means of a decomposition reaction such as one that uses silane, and subjecting a surface of the formed amorphous silicon layer to a rapid heat treatment that improves electrical characteristics of transistors formed from the treated amorphous silicon layer.

The method may further include forming a gas impermeable buffer layer on the plastic substrate before depositing the barrier layer.

In one embodiment, the flexible plastic substrate is supported on a substantially thicker and more rigid dummy glass substrate during processing and the dummy (sacrificial) glass substrate is removed afterwards so as to provide a substantially flexible flat panel display device.

In one embodiment, the barrier layer includes a silicon oxynitride ($Si_xO_yN_z$) wherein the relative concentration of oxygen, $y/(y+z)$ among the nonsilicon atoms has a value O/(N+O) of about 0.35 to about 0.85.

The method may further include removing the dummy glass substrate from the plastic substrate after the barrier layer is formed, fixing the plastic substrate to an additional dummy glass substrate such that the barrier layer is attached to the additional dummy glass substrate, and forming an additional barrier layer on the other surface of the plastic substrate. The predetermined thin film patterns may be formed on the additional barrier layer.

In one embodiment, a buffer layer is formed between the plastic substrate and the barrier layer, and an additional buffer layer is further formed between the plastic substrate and the additional barrier layer.

In one embodiment, the plastic substrate is transparent, composed of one or more organic polymers and has a thickness of about 100 μm to about 300 μm, while each of the barrier layer and the additional barrier layer has a thickness of about 10 nm to 30 nm, and the RF sputtering of the barrier layer is performed with the use a sputter target that contains $Si_3N_4$.

Radio frequency (RF) sputtering may be performed under a radio frequency of about 10 MHz to about 15 MHz, it may be performed using oxygen ($O_2$) and argon (Ar) as supplied reaction/bombardment gases, and it may be performed at a temperature of about 100° C. or below.

BRIEF DESCRIPTION OF THE DRAWINGS

FIG. 2A to FIG. 2D are sectional views of the liquid crystal display shown in FIG. 1 in intermediate steps of a manufacturing method thereof;

DETAILED DESCRIPTION

Figure 1:
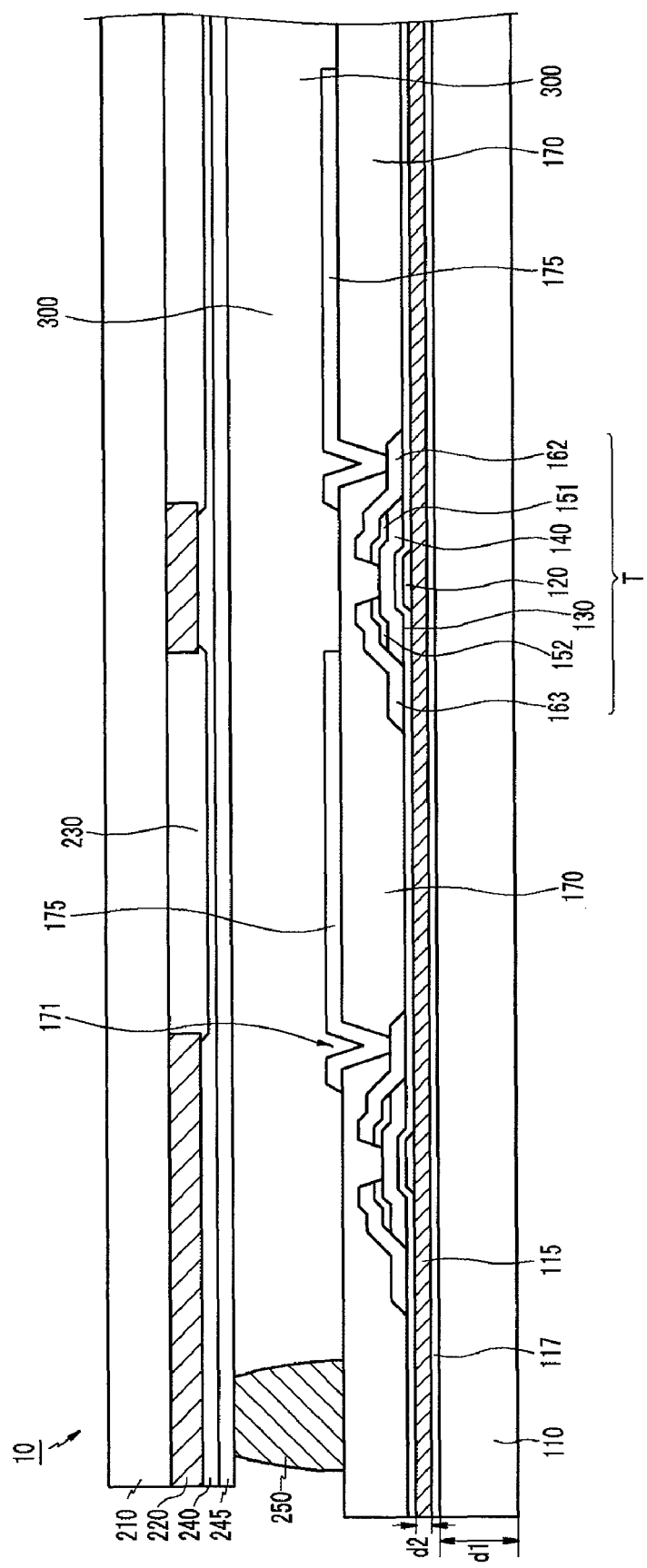
FIG. 1 is a sectional view of a liquid crystal display according to one embodiment.

Hereinafter, although a liquid crystal display is described as one example of a flat panel display formed in accordance with the disclosure, it is to be understood that other flat panel displays such as an organic light emitting device (OLED), a plasma display panel (PDP), etc., may be formed with use of the same basic techniques and that other flexible semiconductive devices such as solar cell arrays using amorphous silicon and a plastic substrate may also be produced in accordance with the disclosure.

In the drawings, the thickness of various layers, films, panels, regions, etc., may be exaggerated for clarity and are thus not all to scale. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a flexible liquid crystal display including a flexible plastic substrate will be described as one example of a flexible flat panel display that is made in accordance with the disclosure.

FIG. 1 is a sectional view showing principal parts of a flexible liquid crystal display 10 according to an embodiment.

Referring to FIG. 1, a flexible liquid crystal display 10 includes a thin film transistor array supporting panel including a first flexible plastic substrate 110, a common electrode supporting panel facing the thin film transistor array supporting panel and including a second flexible plastic substrate 210, and a liquid crystal material layer 300 interposed between the two panels.

Predetermined patterns of electrically conductive materials may be formed on the flexible plastic substrates for displaying images depending on the technology used (LCD or other). The predetermined patterns may include interconnect wiring, thin film field effect transistors, and electrodes as described later.

Each of the flexible and generally transparent plastic substrates 110 and 210 may include one or more of a polycarbon, polyimide, polyether sulfone (PES), polyarylate (PAR), polyethylene naphthalate (PEN), polyethylene terephthalate (PET), and/or other such material. The thickness, d1 of the first plastic substrate 110 may be in the range of about 100 µm to about 300 µm.

A first barrier layer 115 is deposited on top of the first plastic substrate 110 with an optional buffer layer 117 interposed between. The barrier layer 115 may include a gas impermeable material such as $Si_3N_4$ and may be used for preventing gases or moisture that penetrate through from the plastic substrate 110 from further penetrating so as to attack one or more of the thin film layers formed above the first plastic substrate 110.

In one embodiment, the barrier layer 115 is made of one or more of a silicon oxide ($SiO_x$), a silicon nitride ($SiN_x$), a silicon oxynitride ($Si_xO_yN_z$) an aluminum oxide ($Al_2O_3$), and or other relatively transparent materials and the thickness d2 of the barrier layer 115 may be about 10 nm to about 30 nm. If the barrier layer 115 is made of a silicon oxynitride (SiON), then in one embodiment a concentration ratio of the nonsilicon elements O/(N+O) may be about 0.35 to about 0.85. The barrier layer 115 may be formed on the plastic substrate 110 using a radio frequency (RF) sputtering process that is performable with a low temperature process (i.e., at or below about 180° C.). The barrier layer 115 made of silicon oxynitride (SiON) may be deposited using chemical vapor deposition (CVD) or sputtering. The sputtering may be a direct current (DC) sputtering process, a radio frequency (RF) sputtering process, magnetron sputtering, or chemically reactive sputtering. In the case of RF sputtering, the plasma may be maintained under a low argon (Ar) pressure.

In one embodiment, a buffer layer 117 is disposed between the plastic substrate 110 and the barrier layer 115. The buffer layer 117 is used to cure defects (i.e., pinhole openings) of the barrier layer 115. The buffer layer 117 may include a resin such as an acryl-based resin, a urethane-based resin, polyester-based resin, etc. that can appropriately seal pinhole or other such defects in the barrier layer 115.

If the barrier layer 115 has a coefficient of thermal expansion (COTE) that is substantially different from the COTE of the plastic substrate 110 at a temperature higher than a predetermined safe process temperature, then the plastic substrate 110 may be substantially deformed away from a desired planar mode due to the difference of expansion ratios and this warping of the plastic substrate 110 may cause leakage defects to appear in the barrier layer 115. Thereby, the barrier layer 115 may not prevent an undesired gas or vapor from penetrating through the substrate 110 and attacking sensitive thin film layers above. However, with the buffer layer 117 being disposed between the plastic substrate 110 and the barrier layer 115, it is possible to seal the defects of the barrier layer 115 even when the flexible plastic substrate becomes warped due to differences in coefficients of thermal expansion.

Referring to FIG. 1, the illustrated flexible liquid crystal display 10 includes a plurality of gate lines (not shown) and a plurality of data lines (not shown) formed in a matrix form, a plurality of thin film transistors, T, formed at portions where the gate lines and the data lines intersect, and a plurality of pixel electrodes 175 connected to the thin film transistors T.

Each thin film transistor includes a gate electrode formed in the gate line layer, a source electrode and a drain electrode formed in the data line layer, and an active layer made of an amorphous silicon material and disposed between the gate line layer and the data line layer. The amorphous silicon may be formed using low temperature chemical vapor deposition (CVD) such as that including chemical decomposition of a silicon-containing material (i.e., silane).

In one embodiment, the amorphous silicon layer is deposited by a plasma enhanced chemical vapor deposition (PECVD) process using silane ($SiH_4$) and hydrogen ($H_2$) as input reaction gases. During the process some of the silane is decomposed at a relatively low temperature using the hydrogen as a catalyst to drive the reaction in favor of formation of solid silicon which then deposits on the substrate to initially define the amorphous silicon layer.

The gate lines (not shown) transmit gate signals and extend substantially in a transverse direction. Each gate line includes a gate pad (not shown) that is connected to the end of the gate line and receives the gate signals from an external driving circuit and transmits the gate signals to the gate lines, and a plurality of gate electrodes 120.

The data lines (not shown) transmit data signals and extend substantially in the longitudinal direction. Each data line includes a data pad (not shown) that is connected to the end of the data line and receives the image signals from an external driving circuit and transmits the image signals to the data lines, and a plurality of source electrodes 162. A plurality of drain electrodes 163 are separated from the data lines 171, and are disposed opposite the source electrodes 162 to thereby define channel regions whose conductivities may be controlled by voltages applied to the respective gate electrodes 120.

Each thin film transistor T includes the gate electrode 120, a gate-to-thin film insulating layer 130 formed above the gate electrode 120, a semiconductor layer 140 formed above the gate insulating layer 130, ohmic contact layers 151 and 152 formed on the semiconductor layer 140, and the source electrode 162 and drain electrode 163 respectively formed on the ohmic contact layers 151 and 152.

The gate insulating layer 130 may be made of an insulating material such as a silicon nitride ($SiN_x$), a silicon oxide ($SiO_x$), a silicon oxinitride ($SiO_xN_y$), etc. where x and y are process determined variables, where the gate insulating layer 130 optionally extends over the barrier layer 115 even in locations where the gate electrode 120 or its corresponding gate line (not shown) cannot short to another conductor. As seen, the semiconductor layer 140 including reactively-formed amorphous silicon is formed over the gate insulating layer 130 where the latter is disposed over the gate electrode 120 so as to create a capacitive coupling between the gate electrode and the semiconductor layer 140. The ohmic contact layers 151 and 152 may be made of n+ hydrogenated amorphous silicon heavily doped with an n-type impurity so as to provide a nonrectifying contact with the more lightly doped semiconductor layer 140. Here, the ohmic contact layers 151 and 152 are separated from each other and are disposed opposite each other with respect to the corresponding gate electrodes 120.

The source electrodes 162 and drain electrodes 163 are formed of conductive materials that are electrically connected to, and disposed on the corresponding ohmic contact layers 151 and 152.

A passivation layer 170 is formed on the data lines including the source electrode 162, and drain electrode 163. The passivation layer 170 may include a silicon nitride ($SiN_x$), a-Si:C:O or a-Si:C:F deposited by PECVD or another appropriate deposition technique and/or the passivation layer 170 may include an acryl-based organic layer, etc. The passivation layer 170 has a plurality of contact holes 171 exposing the drain electrodes 163 of the thin film transistors T.

A plurality of pixel electrodes 175 are formed on the passivation layer 170 and extend through the contact holes 171 so that each pixel electrode 175 is connected to a corresponding drain electrode 163 through the respective contact hole 171, and thereby the thin film transistor T and the pixel electrode 175 are electrically connected to each other. The pixel electrodes 175 may be made of a conductive material layer such as aluminum (Al) or silver (Ag) having high reflectivity if the LCD is a reflective type of liquid crystal display. The pixel electrodes 175 may be made of a transparent conductive material layer such as indium tin oxide (ITO) or indium zinc oxide (IZO) if the LCD is a transmissive type of liquid crystal display (i.e., backlit type). Alternatively, in a transflective type of liquid crystal display each pixel electrode 175 includes both a transparent electrode region and a reflective electrode region.

Disposed above the thin film transistor (TFT) array supporting panel that includes the first flexible plastic substrate 110, there is provided a common electrode supporting panel that faces the thin film transistor array supporting panel and includes a second flexible plastic substrate 210. The common electrode supporting panel further includes a plurality of black matrix regions 220 formed on the second plastic substrate 210, a plurality of color filters 230 representing three primary colors such as red, green, and blue, and a common electrode 245 formed under the black matrixes 220 and the color filters 230.

A planarizing overcoat layer 240 may be formed between the common electrode 245, and the black matrixes 220 and the color filters 230.

The black matrixes 220 prevent light leakage in areas between the color filters 230 and prevent external light from transmitting to the thin film transistors T to thereby protect against image faults. The black matrixes 220 may have a single-layered structure or a double-layered structure and may be made of chromium, a chromium oxide, and/or a chromium nitride, or are made of a photosensitive organic material including pigments of a black color. Here, the pigments of black color may be carbon black or titanium oxide.

The color filters 230 are placed substantially within the aperture regions enclosed by the black matrixes 220. In one embodiment, the color filters 230 are made of a photosensitive organic material.

The overcoat layer 240 protects the color filters 230 and provides a flat surface. In one embodiment, the overcoat layer 240 is made of an acryl-based epoxy material.

The common electrode 245 is made of a transparent conductive material such as ITO, IZO, etc. The common electrode 245 cooperates with the pixel electrodes 175 to apply desired signal voltages across respective regions of the liquid crystal material layer 300.

If a potential difference between a pixel electrode 175 and the common electrode 245 is generated, an electric field is generated through the liquid crystal layer 300 and the orientation of liquid crystal molecules therein may be determined as a function of the generated electric field.

The first and second supporting display panels which respectively include the first and second flexible plastic substrates, 110 and 210, are assembled to each other using a spacing sealant 250. The liquid crystal material of layer 300 may be introduced between the first and second supporting display panels by use of vacuum injection or drop injection. The sealant 250 minimizes gas or vapor inflow into the space between the two substrates 110 and 210. The sealant 250 may be hardened by light (i.e., UV) and/or heat.

Further, although not shown, additional barrier layers may be disposed on one or both sides of the second flexible plastic substrate 210.

Hereinafter, a method of manufacturing the liquid crystal display shown in FIG. 1 will be described in detail with reference to FIG. 2A to FIG. 2D along with FIG. 3.

Figure 2A:
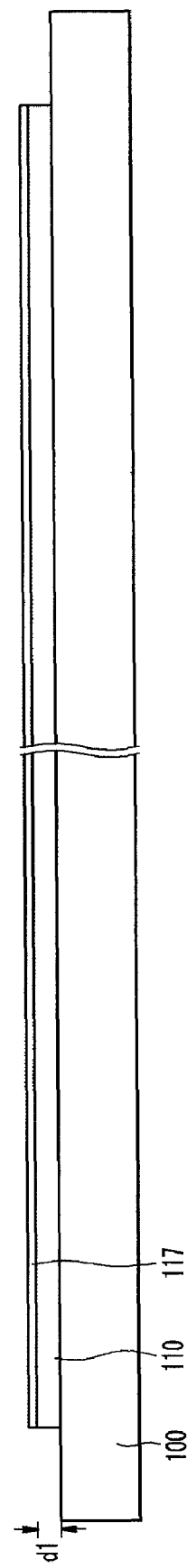
Figure 2B:
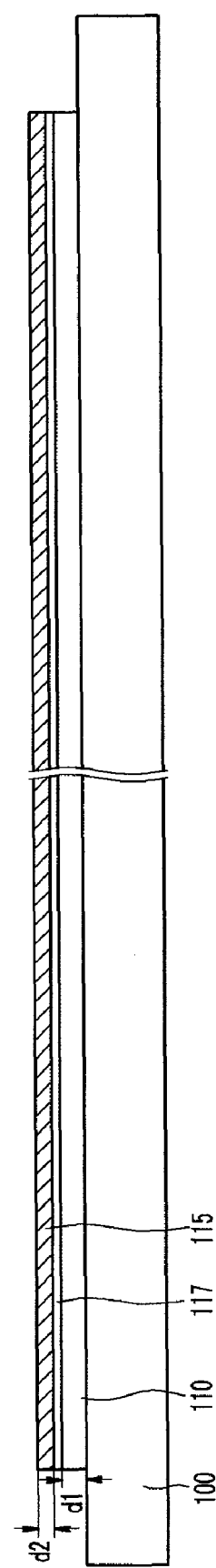
Figure 2D:
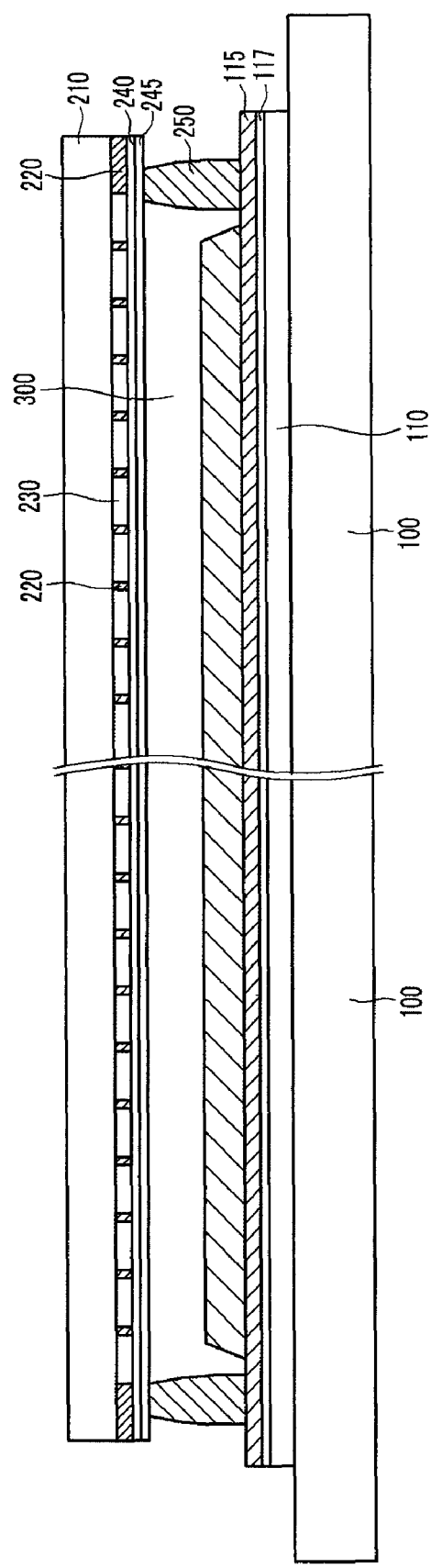
Figure 3:
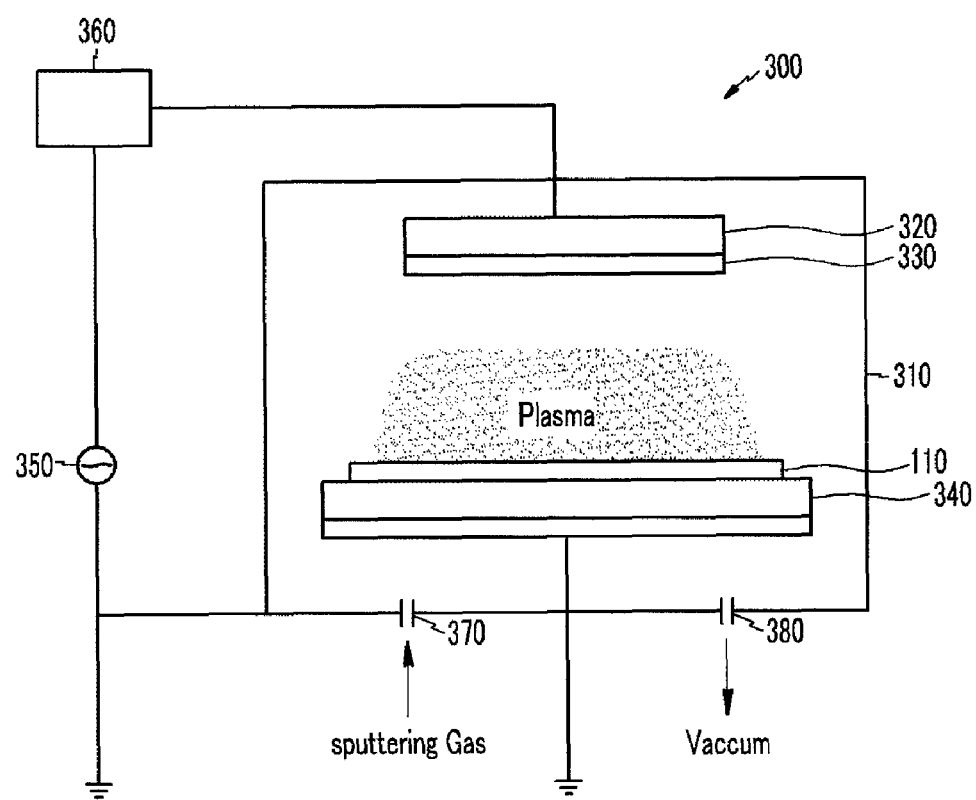
FIG. 3 is a sectional view of an example of an RF sputtering apparatus that may be used in the manufacturing method of FIGS. 2A-2D.

FIG. 2A to FIG. 2D are sectional views of the liquid crystal display shown in FIG. 1 in intermediate steps of the manufacturing method and FIG. 3 is a sectional view of an example of an RF sputtering device that may be used in the manufacturing method.

Referring to FIG. 2A, a flexible plastic substrate 110 is affixed on a planar major surface of a substantially more rigid and thicker dummy glass substrate 100. The flexible plastic substrate 110 is kept in a substantially planar configuration by this affixing to the sacrificial and later removed glass plate so that subsequent fabrication processes may be performed without loss of planarity. In other words, the dummy glass substrate 100 supports the plastic substrate 110 such that predetermined patterns may be formed in accurate positions on the plastic substrate 110 and deformations of the plastic substrate 110 may be reduced during the fabrication processes.

The material of the flexible and substantially optically transmissive plastic substrate 110 may include one or more of a polycarbon, a polyimide, a polyether a sulfone (PES), a polyarylate (PAR), polyethylene a naphthalate (PEN), polyethylene terephthalate (PET), etc. The thickness d1 of the plastic substrate 110 according to one embodiment is about 100 μm to about 300 μm.

After affixation to and planarization by the dummy glass plate 100, a buffer layer 117, such as one including a resin, for example an acryl-based resin, a urethane-based resin, or a polyester-based resin, etc., is optionally formed on the plastic substrate 110 by coating, screen printing, etc. so as to provide defect repair for the subsequently added barrier layer (115 in FIG. 2B). Formation of the buffer layer 117 may be omitted.

Next, as shown in FIG. 2B, a barrier layer 115 such as one including a silicon oxynitride (SiON) is formed on the plastic substrate 110. Formation of the barrier layer 115 may be performed at about 90° C. to about 200° C. The barrier layer 115 may have a thickness d2 of about 10 nm to about 30 nm. The barrier layer 115 may have a concentration ratio of oxygen to other nonsilicon elements (i.e., O/(N+O) of about 0.35 to about 0.85. The barrier layer 115 prevents gas, moisture or other vapors from penetrating through the substrate 110 to thereby attack a plurality of possibly sensitive layers formed by subsequent processes on top of the plastic substrate 110. The barrier layer 115 also helps to prevent deformation of the plastic substrate 110 during subsequent processes.

The barrier layer 115 may be formed by RF sputtering performed with a relatively low temperature process. The barrier layer 115 made of silicon oxynitride (SiON) may be deposited using chemical vapor deposition (CVD) or sputtering. In the RF sputtering case, a reactive plasma may be maintained under a low argon (Ar) pressure where the plasma oxidizes and/or nitridates a silicon-containing material provided from the sputter target.

In one embodiment, the barrier layer 115 is formed using an RF sputtering device 300 as shown in FIG. 3

The RF sputtering device 300 includes a vacuum chamber 310 defining a reaction space, an upper electrode 320 located in the upper side of the vacuum chamber 310, a target 330 fixed to the upper electrode 320, a lower electrode 340 located in the lower side of the vacuum chamber 310 and facing the upper electrode 320, an RF power unit 350 supplying power to the upper electrode 320, and an impedance matching unit 360 located between the RF power unit 350 and the upper electrode 320. The vacuum chamber 310 has an inflow port 370 and an outlet port 380. Gases such as the reaction gas (i.e., $O_2$ or $NO_2$ or NO) and argon (Ar) flow into the vacuum chamber 310 through the inflow port 370. The outlet port 380 is connected to a vacuum pump (not shown) such that a low pressure (vacuum) state is preserved in the chamber.

The plastic substrate 110 supported by the glass substrate 100 is installed on the lower electrode 340 (pedestal). Here, the upper electrode 320 is connected to the RF power unit 350 and the lower electrode 340 is grounded. The target 330 may include $Si_3N_4$. The upper electrode 320 is supplied with RF power, and then a plasma is generated by a voltage difference between the upper electrode 320 and the lower electrode 340.

The plasma causes the input argon flow to become ionized, and the ionized argon gas bombards the target 330. Accordingly, particles of $Si_3N_4$ of the target are sputtered off and ionized due to the collision of the ionized argon gas and the target 330, and the ionized Si and N atoms are deposited on the plastic substrate 110 in combination with oxygen atoms released from the reaction gas. The RF power may have a radio frequency of about 10 MHz to about 15 MHz, and particularly the RF power may have a radio frequency of about 13.56 MHz. Here, the deposition may be performed at about 90° C. to 200° C., and more specifically it may be performed at about 100° C. or below.

Next, predetermined patterns such as of conductive materials for displaying images are formed on the barrier layer 115 as shown in FIG. 2C.

The predetermined patterns may include a plurality of interconnect wirings, a plurality of thin film transistors T, and a plurality of electrodes, such as described above.

Now, a formation method for defining the semiconductor layer of the thin film transistor T will be described in detail. The semiconductor layer of the thin film transistor T includes amorphous silicon. However, amorphous silicon can have different distributions mixed with other materials as shall become apparent.

Firstly, an amorphous silicon layer is deposited by low temperature chemical vapor deposition (CVD) based on decomposition of a silicon containing material such as silane ($SiH_4$). The amorphous silicon layer may be deposited with this process at about 90° C. to about 200° C., and more specifically in one embodiment at about 100° C. to about 180° C.

Next, in accordance with the present disclosure the CVD-created amorphous silicon layer is subjected to rapid heat treatment for enhancing electrical and purity characteristics of the amorphous silicon layer. Here, the heat treatment may be performed before or after the amorphous silicon layer is patterned, or may be performed after other layers such as electrodes or the passivation layer are formed on the semiconductor layer. Here, the rapid heat treatment may be performed in a manner where substantial deformation of the plastic substrate does not happen.

The rapid heat treatment may be performed by using an oven, a lamp such as a xenon lamp or a halogen lamp, or a laser. The rapid heat treatment may be performed by ramping up at a rate of about 0.5.degree. C./second to about 20.degree. C./second and/or by ramping down at a rate of about 0.5.degree. C./minute to about 10.degree. C./minute, and may be more specifically performed by ramping up at a rate of about 1.5.degree. C./second to about 3.degree. C./second.

In one embodiment, the oven is used to ramp up the temperature of the amorphous silicon layer from room temperature to a high temperature of about 180° C. to about 300° C. in the course of about 1 minute to about 5 minutes. Once the predetermined high temperature is briefly obtained, the amorphous silicon layer may be cooled back to room temperature for example by removing it from the oven and exposing it to ambient temperature.

In another embodiment, the plastic substrate 110 having the amorphous silicon layers is exposed to a heating space that was previously heated to about 500° C. to about 800° C. by a radiant heating means such as a xenon lamp or a halogen lamp, for a couple of seconds to several tens of seconds. The plastic substrate 110 having the amorphous silicon layers is passed through any heating space, which is already preheated to a high temperature of about 500° C. to about 800° C. by using a xenon RTP lamp or a halogen RTP lamp, in the course of about from a couple of seconds to several tens of seconds.

In another embodiment, the rapid heat treatment is performed using a spot laser, wherein the plastic substrate 110 having the amorphous silicon layer are selectively subjected to a laser beam having a wavelength of about 280 nm to about 320 nm and an energy density of about 190 mJ/cm$^2$ to about 240 mJ/cm$^2$.

As described above, in the manufacturing method of the flexible liquid crystal device according to the disclosed embodiments, the amorphous silicon layer is subjected to a rapid heat treatment for a short but sufficient time such that a substantial portion of excess hydrogen left over from the CVD-formation process is driven out from the amorphous silicon layer and/or dangling silicon bonds are cured so as to thereby create a more homogeneous distribution of stoichiometric amorphous silicon. Removal of the excess hydrogen helps to enhance electrical characteristics of transistors formed from the heat-treated amorphous silicon layer as shall be seen in FIG. 5. The timing and thermal budget of the rapid heat treatment process is controlled so as to prevent substantial deformations of the underlying plastic substrate 110.

Referring to FIG. 2D, a second flexible plastic substrate 210 having a plurality of layers is aligned with the first flexible plastic substrate 110 having a plurality of layers such that the two substrates face each other, then the two facing plastic substrates 110 and 210 are assembled using a sealant 250.

Finally, the dummy glass substrate 100 is removed from the plastic substrate 110 to complete formation of the flexible liquid crystal display 10. In one embodiment, the dummy glass substrate 100 is of sufficient thickness so as to act as a heat sink during the rapid heat treatment process and thereby help to prevent deformation of or damage to the substantially thinner flexible plastic substrate 110.

Now, a method of manufacturing the liquid crystal display shown in FIG. 1 according to another embodiment will be described in detail with reference to FIG. 4A to FIG. 4C.

Figure 4A:
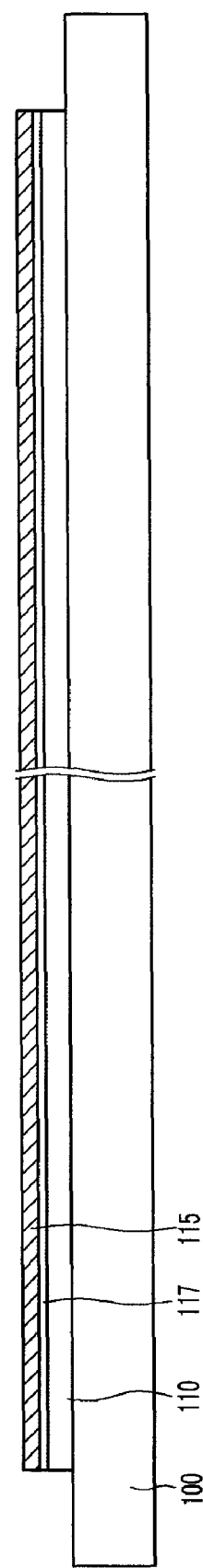
FIG. 4A to FIG. 4C are sectional views of the liquid crystal display shown in FIG. 1 in intermediate steps of a second manufacturing method.
Figure 4B:
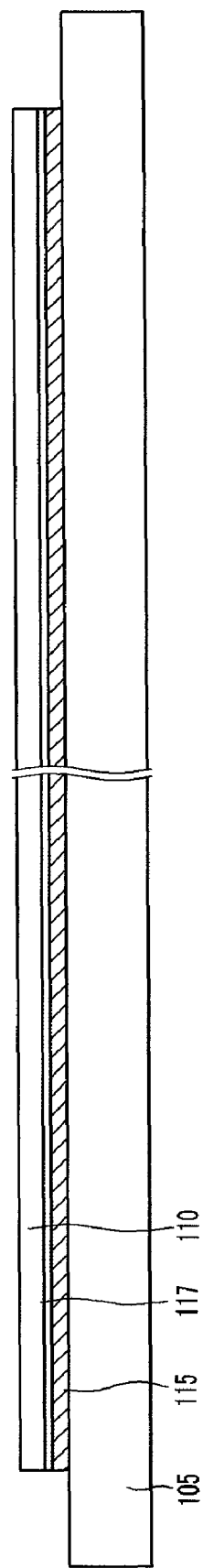
Figure 4C:
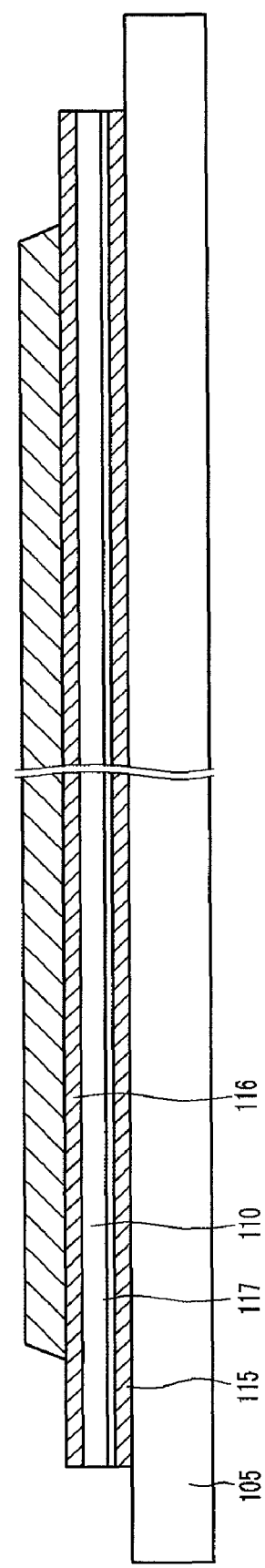

FIG. 4A to FIG. 4C are sectional views of the liquid crystal display shown in FIG. 1 in intermediate steps of a manufacturing method thereof according to another embodiment.

For this second embodiment, only distinctive features relative to the embodiment described above will be described and similar features will be omitted. The omitted features correspond to the features described above.

Referring to FIG. 4A, a barrier layer 115 is formed on one surface of a plastic substrate 110 while the latter is affixed to a first dummy glass substrate 100.

The plastic substrate 110 is removed from the first dummy glass substrate 100, and then the barrier layer 115 is affixed on another dummy glass substrate 105 as shown in FIG. 4B.

Referring to FIG. 4C, an additional barrier layer 116 is formed on the other surface of the plastic substrate 110 fixed to the second dummy glass substrate 105. Thereafter, predetermined patterns for displaying images (including an amorphous silicon layer) are formed on the barrier layer 116 as shown in FIG. 4C.

Here, the predetermined patterns may include a plurality of wirings, a plurality of thin film transistors, and a plurality of electrodes as described above.

Particularly, in one embodiment, a formation method of a semiconductor layer of the thin film transistor includes depositing an amorphous silicon layer by low temperature chemical vapor deposition (e.g., decomposition of silane) and performing rapid heat treatment to the deposited amorphous silicon layer for thereby enhancing electrical characteristics of the amorphous silicon layer.

As described above, the amorphous silicon layer may be deposited at about 90° C. to about 200° C., and more specifically, may be deposited at about 100° C. to about 180° C.

The rapid heat treatment may be performed at about 180° C. to about 800° C.

If the rapid heat treatment is performed to temperature above about 800° C., the amorphous silicon layer may be crystallized. Accordingly, the rapid heat treatment for device including amorphous silicon layer should be performed at under about 800° C.

Now, electrical characteristics of the semiconductor layer of the thin film transistors will be described in detail with reference to FIG. 5 and FIG. 6.

In one embodiment, silane ($SiH_4$) is used as the source material for the CVD-created silicon. FIG. 5 is a graph representing deviation of reaction free energy (variation in Gibbs energy) depending on the temperature maintained during a decomposition reaction of $SiH_4 \rightarrow Si + 2H_2$ and FIG. 6 is a graph representing a drain current versus gate voltage characteristics of thin film transistors formed by the manufacturing methods described above both with and without use of the rapid heating treatment.

Figure 5:
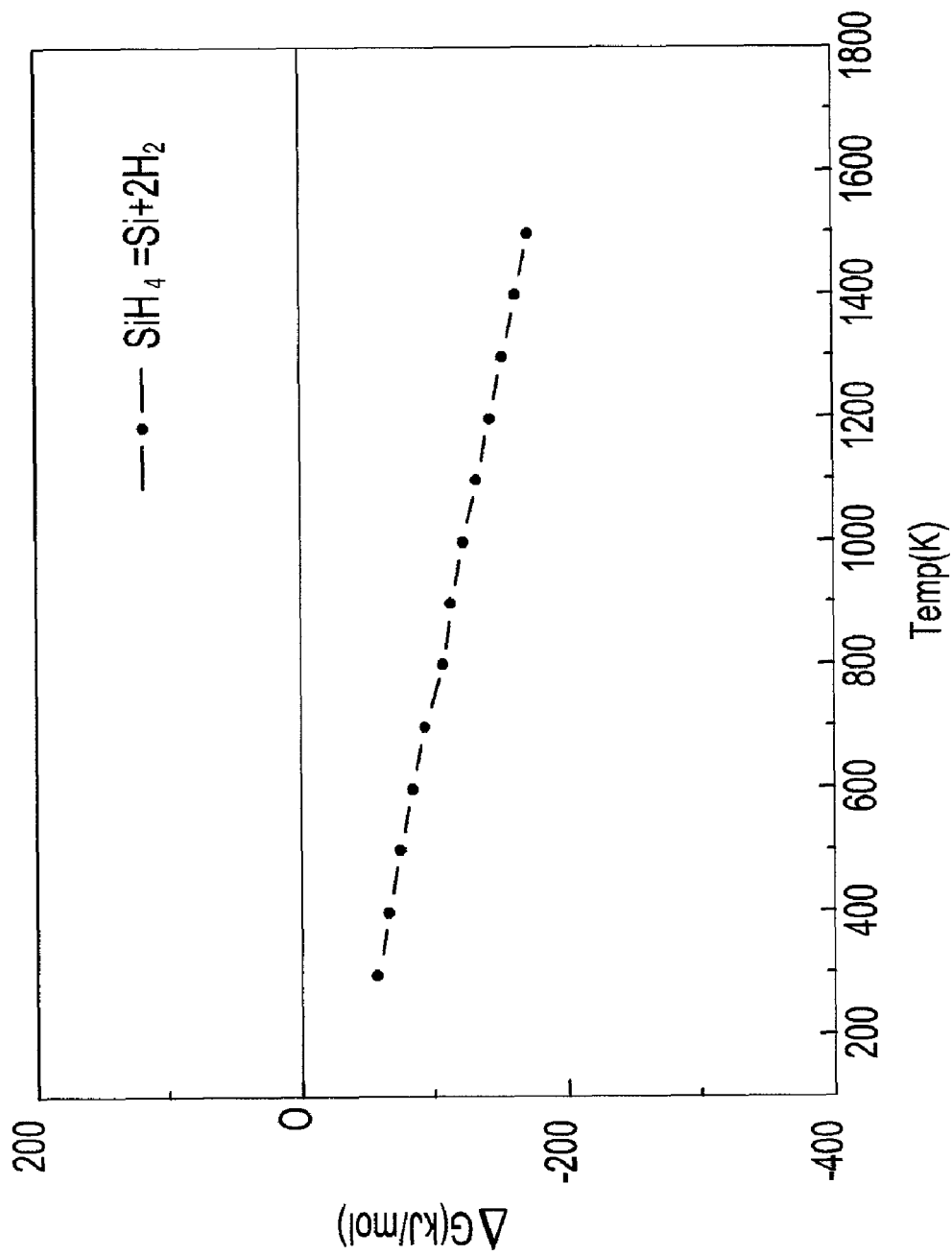
FIG. 5 is a graph representing deviation of reaction free energy depending on temperature in a silane decomposition reaction, $SiH_4 \rightarrow Si+2H_2$.

Referring to FIG. 5, Gibbs free energy for the silane decomposition reaction that takes place during deposition of the amorphous silicon layer using CVD decreases with increasing temperature and thus the reaction is driven more to the right as temperature increases.

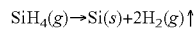

Accordingly, the above decomposition reaction is more vigorous at a high temperature and is generally less vigorous or not active at substantially lower temperatures. Accordingly, $SiH_4$ gas may not be completely decomposed at a low temperature and therefore the amorphous silicon layer which is deposited by low temperature chemical vapor deposition may include silicon atoms that are not fully stripped of hydrogen atoms and/or silicon atoms that have dangling bonds. The silicon may be of a porous solid state structure where the pores are filled with hydrogenated silicon rather than essentially only silicon (this not counting any P or N type conductivity dopants that may have been introduced during the CVD process).

Figure 6:
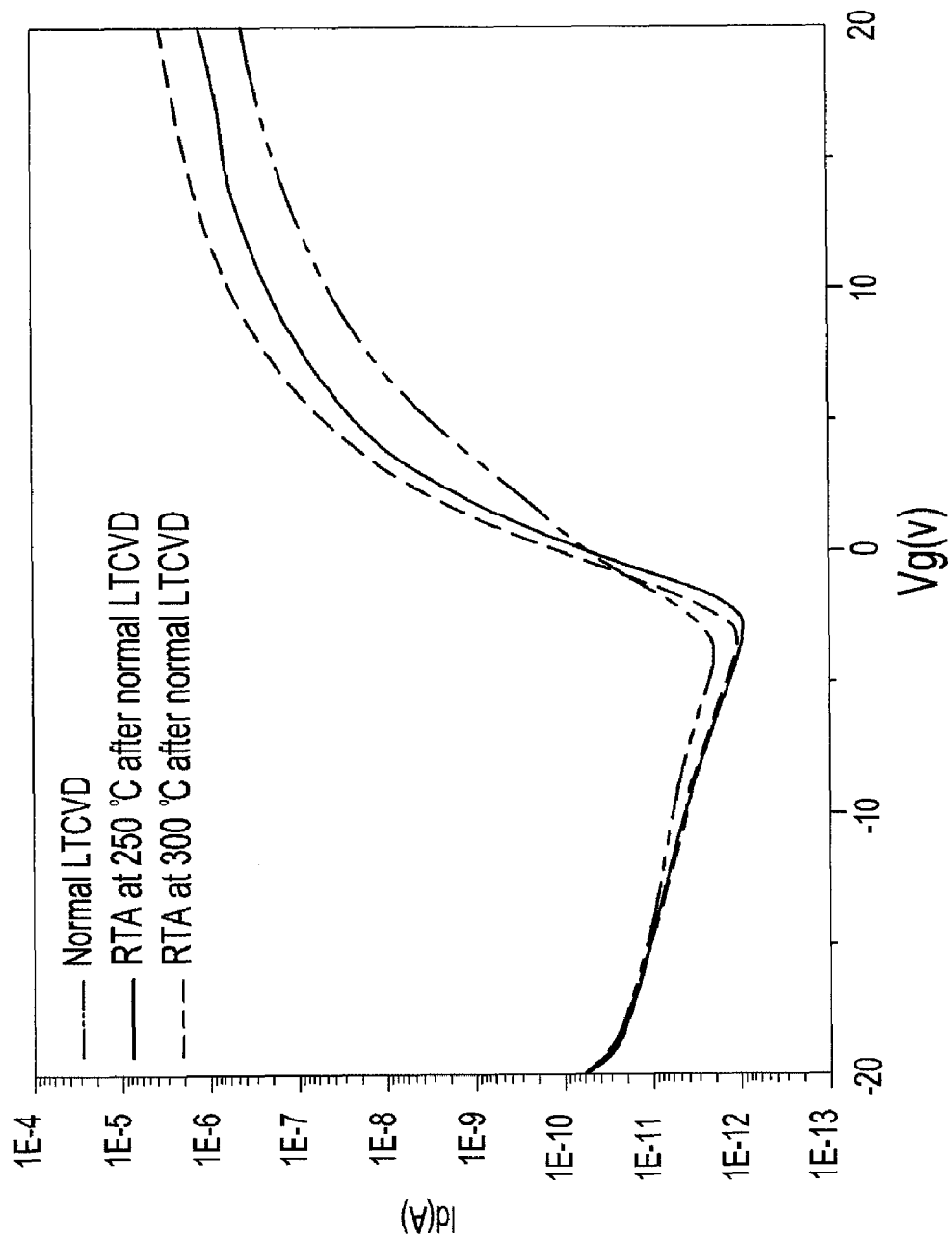
FIG. 6 is a graph representing a drain current versus gate voltage characteristics of thin film transistors formed with and without the disclosed heat treatment.

However, in the manufacturing method of the flexible liquid crystal device according to the embodiments above, the CVD-formed amorphous silicon layer is subjected to rapid heat treatment for a short time such that at least a substantially portion of the excessive hydrogen is eliminated from the amorphous silicon layer and/or dangling silicon bonds are cured so as to thereby enhance electrical characteristics of the transistors formed from the amorphous silicon layer as is illustrated for example in FIG. 6.

Now, a performance characteristic variation of the thin film transistor according to experimental examples according to disclosed embodiments will be described with reference to FIG. 6.

In an Experimental Example, and for the purpose of comparatively measuring the effects of rapid heat treatment on the CVD-formed amorphous silicon layer, the amorphous silicon layers were deposited using low temperature CVD (LTCVD) at about 100° C., and for one set of such transistors rapid heat treatment was not performed (denoted as Normal LTCVD), while for a second set of such transistors rapid heat treatment was performed to a high temperature of about 250° C. (denoted as RTA at 250° C.), and for a third set of such transistors rapid heat treatment was performed to a high temperature of about 300° C. (denoted as RTA at 300° C.), and then the $I_{ds}$ versus $V_{gs}$ performance of the thin film transistors having these differently treated amorphous silicon layers were respectively measured. Here, the other conditions were the same except that in the case where the rapid heat treatment were carried out, the rapid heat treatments were controlled so that substantial deformation of the plastic substrate did not occur.

Referring to FIG. 6, the thin film transistors under the rapid heat treatment (RTA at 250° C. and RTA at 300° C.) exhibited better current characteristics (e.g., higher forward currents and/or smaller reverse bias leakage currents) than that exhibited by the transistors formed without use of rapid heat treatment (normal LTCVD). The heat treated transistors therefore have more desirable drain current versus gate voltage characteristics for use in a liquid crystal or other flat panel display.

Accordingly, in the manufacturing method of a flexible liquid crystal flat panel display or in the manufacture of another type of flat panel display having a flexible plastic substrate and an amorphous silicon layer deposited at relatively low temperature, the amorphous silicon layer is subjected to rapid heat treatment for a short time at least in locations where transistors will be formed so that excessive hydrogen may be driven out from the amorphous silicon layer and/or dangling bonds may be cured so as to thereby enhance electrical characteristics of transistors formed from the amorphous silicon layer while at the same time preventing substantial deformation of the underlying plastic substrate.

As described above, the rapid heat treatment may be performed using an oven, an RTP lamp such as a xenon lamp or a halogen lamp, or a laser.

When using the oven, in one embodiment the amorphous silicon layer is heated over a temperature ranging from room temperature to high temperature of about 180° C. to about 300° C. for about 1 minute to about 5 minutes. Once the predetermined high treatment temperature is obtained, the amorphous silicon layer is cooled.

When using the xenon lamp or the halogen lamp in one embodiment, the plastic substrate 110 having the amorphous silicon layers is passed through a heating space, which is already preheated to about 500° C. to about 800° C. for a couple of seconds to several tens of seconds.

When the heat treatment is performed using a laser, the plastic substrate 110 having the amorphous silicon layers is subjected to a laser beam having a wavelength of about 280 nm to about 320 nm and an energy density of about 190 mJ/cm$^2$ to about 240 mJ/cm$^2$ so as to thereby heat the amorphous silicon layers to the desired temperatures.

While a number of practical and exemplary embodiments have been described above, it is to be understood that the present disclosure is not limited to the above disclosed flat panel display embodiments, but, on the contrary, is intended to cover various modifications and equivalent arrangements included within the spirit and scope of the disclosure, including other applications where thin film transistors are to be formed on a temperature sensitive substrate (i.e., a plastic substrate) where the temperature sensitive substrate can be adversely affected by excessively long exposures to relatively high temperatures.

What is claimed is:

1. A manufacturing method comprising:
depositing an amorphous silicon layer over a plastic substrate by way of a chemical vapor deposition (CVD) process, where the CVD process tends to leave behind substantial amounts of hydrogen and/or other undesired elements that impede homogeneous formation of stoichiometric amorphous silicon; and
subjecting at least regions of the amorphous silicon layer to a rapid heat treatment that enhances removal of substantial portions of the left-behind hydrogen and/or other undesired elements while not substantially affecting the plastic substrate adversely,
wherein the rapid heat treatment includes ramping up temperature at a rate of about 0.5° C./second to about 20° C./second and ramping down temperature at a rate of about 0.5° C./minute to about 10° C./minute.

2. The method of claim 1, further comprising:
forming a barrier layer on the plastic substrate before depositing the amorphous silicon layer, where the barrier layer is substantially impermeable to a predefined one or more gases or vapors.

3. The method of claim 2, wherein the barrier layer includes a silicon oxynitride ($Si_xO_yN_z$) and x, y and z are predetermined numbers.

4. The method of claim 3, wherein the barrier layer has a concentration ratio of oxygen to other non-silicon elements of about 0.35 to about 0.85.

5. The method of claim 3, further comprising:
forming a buffer layer between the plastic substrate and the barrier layer.

6. The method of claim 5, wherein said buffer layer is structured to cure defects in the barrier layer.

7. The method of claim 3, wherein the plastic substrate has a thickness of about 100 μm to about 300 μm.

8. The method of claim 3, wherein the barrier layer has a thickness of about 10 nm to about 30 nm.

9. The method of claim 3, wherein the barrier layer is formed by radio frequency (RF) sputtering using a target containing $Si_3N_4$.

10. The method of claim 9, wherein the radio frequency (RF) sputtering is performed under radio frequency of about 10 MHz to about 15 MHz.

11. The method of claim 9, wherein radio frequency (RF) sputtering is performed using oxygen ($O_2$) and argon (Ar) as reaction gases.

12. The method of claim 9, wherein the radio frequency (RF) sputtering is performed at a temperature of about 100° C. or below.

13. The method of claim 1, wherein the chemical vapor deposition is performed at no more than about 180° C.

14. The method of claim 1, wherein the rapid heat treatment includes heating a maximum temperature of about 300° C. for about 1 minute to about 5 minutes using an oven.

15. The method of claim 1, wherein the ramping up rate is about 1.5° C./second to about 3° C./second.

16. A manufacturing method comprising:
depositing an amorphous silicon layer over a plastic substrate by way of a chemical vapor deposition (CVD) process, where the CVD process tends to leave behind substantial amounts of hydrogen and/or other undesired elements that impede homogeneous formation of stoichiometric amorphous silicon; and
subjecting at least regions of the amorphous silicon layer to a rapid heat treatment that enhances removal of substantial portions of left-behind hydrogen and/or other undesired elements while not substantially affecting the plastic substrate adversely,
wherein the rapid heat treatment includes subjecting the amorphous silicon layer to heat generated by a laser beam having a wavelength of about 280 nm to about 320 nm and an energy density of about 190 mJ/cm$^2$ to about 240 mJ/cm$^2$; and
wherein the rapid heat treatment causes the amorphous silicon layer to undergo a ramping up of its temperature at a rate of about 0.5° C./second to about 20° C./second and ramping down of its temperature at a rate of about 0.5° C./minute to about 10° C./minute.

17. A manufacturing method comprising:
fixing a plastic substrate on a dummy glass substrate;
forming a barrier layer on the plastic substrate by RF sputtering;
depositing an amorphous silicon layer on the barrier layer by chemical vapor deposition; and
subjecting the amorphous silicon layer to a rapid heat treatment,
wherein the chemical vapor deposition is performed at about 90° C. to about 180° C., and the rapid heat treatment is performed at about 150° C. to about 800° C., and
wherein the rapid heat treatment includes ramping up temperature at a rate of about 0.5° C./second to about 20° C./second and ramping down temperature at a rate of about 0.5° C./minute to about 10° C./minute.

18. The method of claim 17, wherein the chemical vapor deposition is performed at about 90° C. to about 130° C., and the rapid heat treatment is performed at about 200° C. to about 500° C.

19. The method of claim 18, wherein the barrier layer includes a silicon oxynitride (SiON) and the barrier layer has a concentration ratio of elements O/(N+O) of about 0.35 to about 0.85.

20. The method of claim 17, wherein said chemical vapor deposition process is one that tends to leave behind substantial amounts of hydrogen or other undesired elements still bound to silicon atoms of the amorphous silicon layer.

21. The method of claim 17, wherein said rapid heat treatment is one that enhances removal of substantial portions of the left-behind hydrogen and/or other undesired elements while not substantially affecting the plastic substrate adversely.

* * * * *